(12) United States Patent
Ito

(10) Patent No.: US 10,128,311 B2
(45) Date of Patent: Nov. 13, 2018

(54) MAGNETIC MEMORY DEVICE

(71) Applicant: TOSHIBA MEMORY CORPORATION, Minato-ku, Tokyo (JP)

(72) Inventor: Yuichi Ito, Seongnam-si (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/691,469

(22) Filed: Aug. 30, 2017

(65) Prior Publication Data

US 2018/0269255 A1  Sep. 20, 2018

Related U.S. Application Data

(60) Provisional application No. 62/473,056, filed on Mar. 17, 2017.

(51) Int. Cl.
*G11C 11/16* (2006.01)
*H01L 27/22* (2006.01)
(Continued)

(52) U.S. Cl.
CPC .......... *H01L 27/228* (2013.01); *G11C 11/161* (2013.01); *G11C 11/1673* (2013.01);
(Continued)

(58) Field of Classification Search
CPC ....... H01L 27/228; H01L 43/12; H01L 43/08; H01L 43/02; H01L 23/552; H01L 43/10;
(Continued)

(56) References Cited

U.S. PATENT DOCUMENTS 6,958,927 B1 * 10/2005 Nguyen ............... G11C 11/16
257/295
7,009,877 B1 * 3/2006 Huai ..................... G11C 11/16
257/E27.005
(Continued)

FOREIGN PATENT DOCUMENTS

| JP | 2013242960 A | 12/2013 |
| JP | 2013243336 A | 12/2013 |
| JP | 2015082564 A | 4/2015 |

OTHER PUBLICATIONS

K. Kurotsuchi, et al., "2.8-GB/s-write and 670-MB/s-erase operations of a 3D vertical chain-cell-type phase-change-memory array," 2015 Symposium on VLSI Technology Digest of Technical Papers, Jun. 17, 2015, pp. T92-T93.

*Primary Examiner* — Khamdan Alrobaie
(74) *Attorney, Agent, or Firm* — Holtz, Holtz & Volek PC

(57) ABSTRACT

According to one embodiment, a magnetic memory device includes a memory cell array unit including magnetoresistive elements provided in an array in first and second directions, each including a first magnetic layer having a variable magnetization direction, a second magnetic layer having a fixed magnetization direction, and a nonmagnetic layer between the first and second magnetic layers, first transistors provided in an array in the first and second directions, and electrically connected to the magnetoresistive elements, respectively, switching units each electrically connected to corresponding ones of the first transistors in series, and each including at least one second transistor, wherein the first magnetic layers are separated from each other in the first and second directions, and the second magnetic layers are continuously provided in the first and second directions.

20 Claims, 17 Drawing Sheets

(51) Int. Cl.
*H01L 43/02* (2006.01)
*H01L 43/08* (2006.01)
*H01L 23/552* (2006.01)
*H01L 43/12* (2006.01)
*H01L 43/10* (2006.01)

(52) U.S. Cl.
CPC ............ *H01L 23/552* (2013.01); *H01L 43/02* (2013.01); *H01L 43/08* (2013.01); *H01L 43/12* (2013.01); *H01L 43/10* (2013.01)

(58) Field of Classification Search
CPC . G11C 11/1673; G11C 11/161; G11C 11/155; G11C 11/02
See application file for complete search history.

(56) References Cited

U.S. PATENT DOCUMENTS

| | | | |
|---|---|---|---|
| 8,482,967 B2* | 7/2013 | Xi | ............ H01L 27/228 365/158 |
| 8,897,061 B2 | 11/2014 | Ezaki | |
| 2003/0214762 A1* | 11/2003 | Sharma | ................. B82Y 25/00 360/324.2 |
| 2010/0091549 A1* | 4/2010 | Lee | ........................ G11C 11/16 365/148 |
| 2012/0286339 A1 | 11/2012 | Asao | |
| 2013/0037862 A1 | 2/2013 | Kitagawa et al. | |
| 2014/0319590 A1 | 10/2014 | Nakatsuka | |
| 2016/0260774 A1 | 9/2016 | Umebayashi et al. | |
| 2016/0379701 A1 | 12/2016 | Nakatsuka et al. | |
| 2017/0103792 A1* | 4/2017 | Itai | ........................ G11C 11/16 |

* cited by examiner

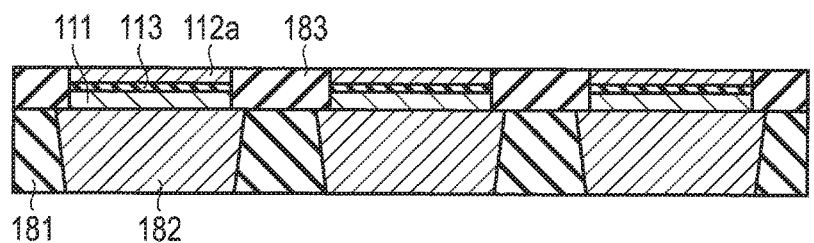
F I G. 16
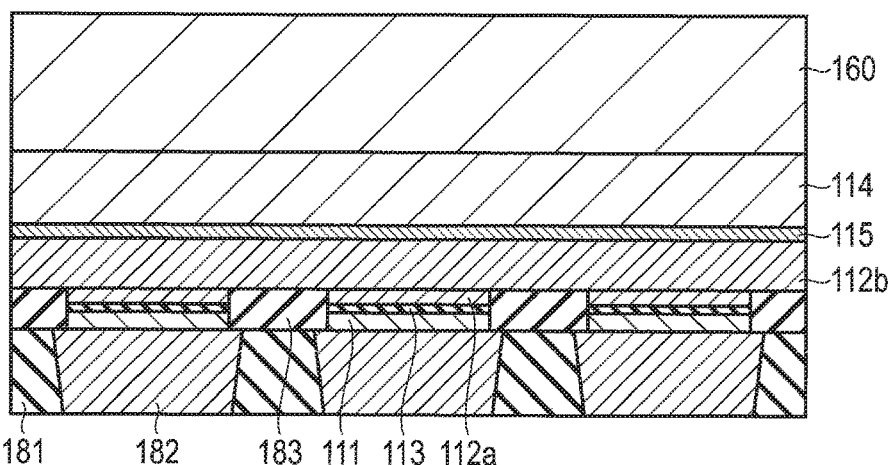
F I G. 17
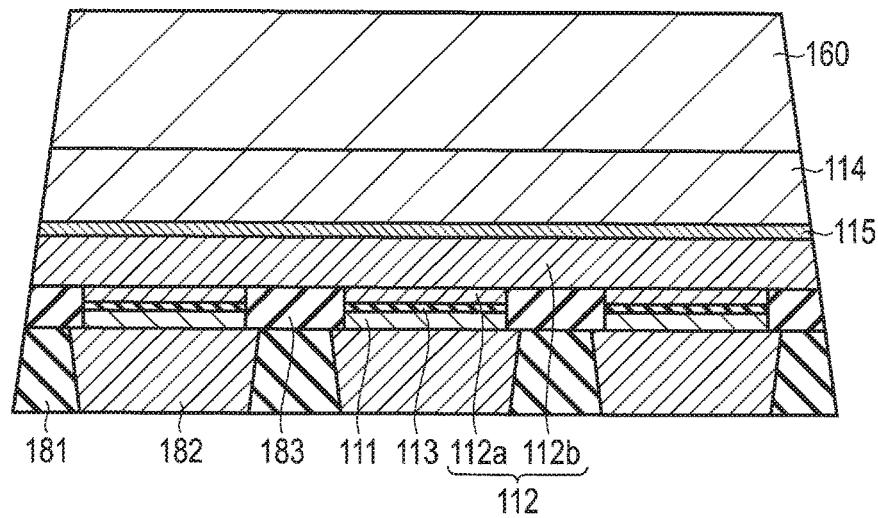
F I G. 18

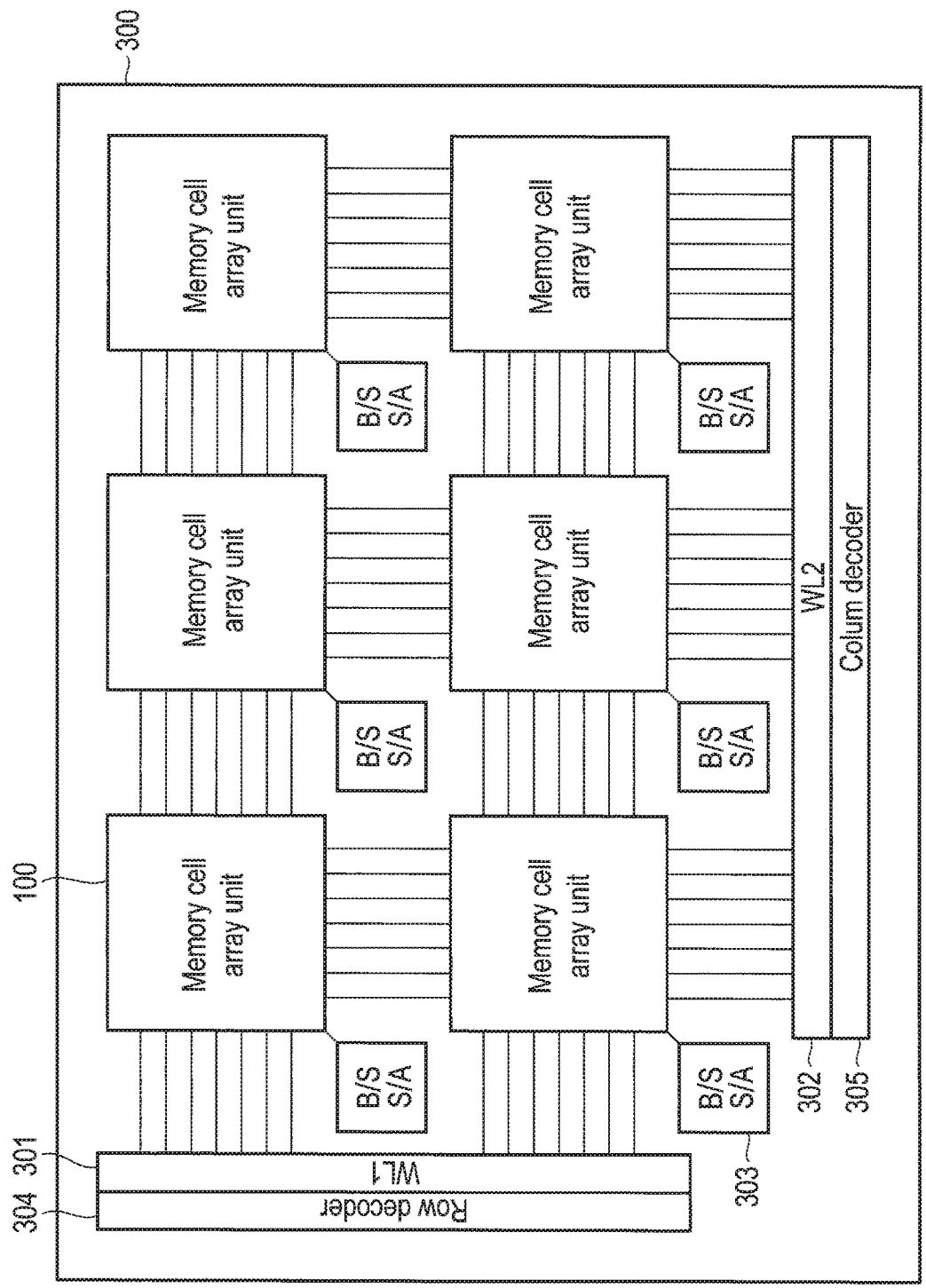
F I G. 34

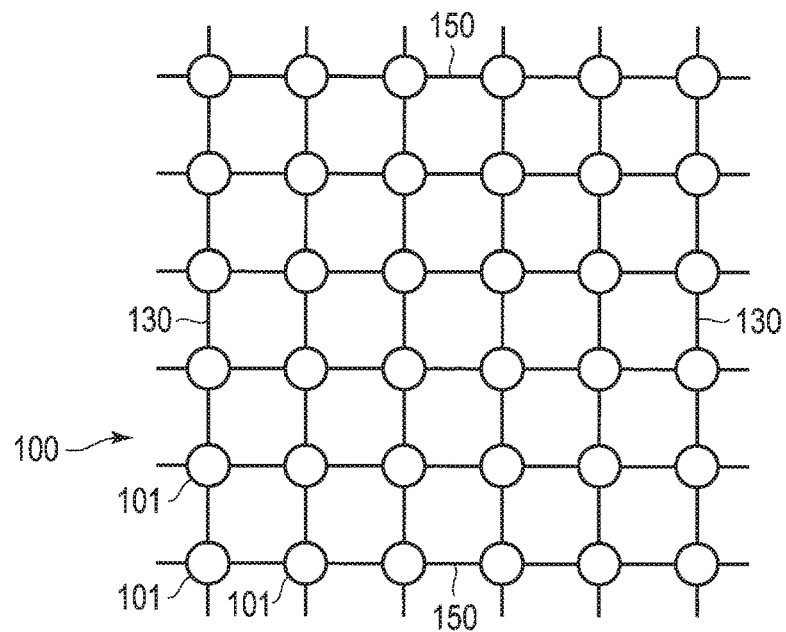
F I G. 35
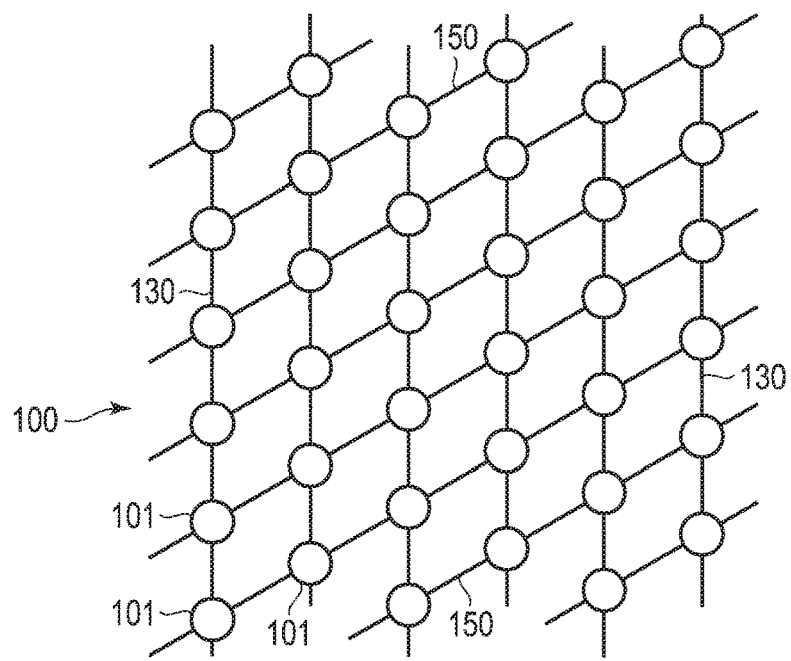
F I G. 36

MAGNETIC MEMORY DEVICE

CROSS-REFERENCE TO RELATED APPLICATIONS

This application claims the benefit of U.S. Provisional Application No. 62/473,056, field Mar. 17, 2017, the entire contents of which are incorporated herein by reference.

FIELD

Embodiments described herein relate generally to a magnetic memory device.

BACKGROUND

A magnetic memory device (semiconductor integrated circuit device) manufactured by integrating a plurality of magnetoresistive elements and a plurality of transistors on a semiconductor substrate is suggested.

If the element size is reduced by scaling in the magnetic memory device, it is difficult to satisfy the desired characteristics.

BRIEF DESCRIPTION OF THE DRAWINGS

FIG. 16 is a cross-sectional view schematically showing a part of the first manufacturing method of the magnetic memory device of the embodiment.

FIG. 17 is a cross-sectional view schematically showing a part of the first manufacturing method of the magnetic memory device of the embodiment.

FIG. 18 is a cross-sectional view schematically showing a part of the first manufacturing method of the magnetic memory device of the embodiment.

FIG. 34 is a block diagram showing a second structural example of a magnetic memory device (semiconductor integrated circuit device) comprising a plurality of memory cell array units according to the embodiment.

FIG. 35 is a plan view schematically showing the layout of memory cells, the first word lines and the second word lines in each memory cell array unit according to the embodiment.

FIG. 36 is a plan view schematically showing the layout of the memory cells, the first word lines and the second word lines in each memory cell array unit according to a modification example of the embodiment.

DETAILED DESCRIPTION

In general, according to one embodiment, a magnetic memory device includes a memory cell array unit, the memory cell array unit including: a plurality of magnetoresistive elements provided in an array form in a first direction and a second direction, each of the magnetoresistive elements including a first magnetic layer having a variable magnetization direction, a second magnetic layer having a fixed magnetization direction, and a nonmagnetic layer between the first magnetic layer and the second magnetic layer; a plurality of first transistors provided in an array form in the first direction and the second direction, and electrically connected to the magnetoresistive elements, respectively; a plurality of first word lines each extending in the first direction, and each selecting corresponding first transistors from the plurality of first transistors; a plurality of switching units each electrically connected to corresponding first transistors of the plurality of first transistors in series, and each including at least one second transistor; and a plurality of second word lines each extending in the second direction, and each selecting a corresponding switching unit from the plurality of switching units, wherein the first magnetic layers included in the magnetoresistive elements are separated from each other in the first and second directions, and the second magnetic layers included in the magnetoresistive elements are continuously provided in the first and second directions.

An embodiment will be described hereinafter with reference to the accompanying drawings.

Figure 1:
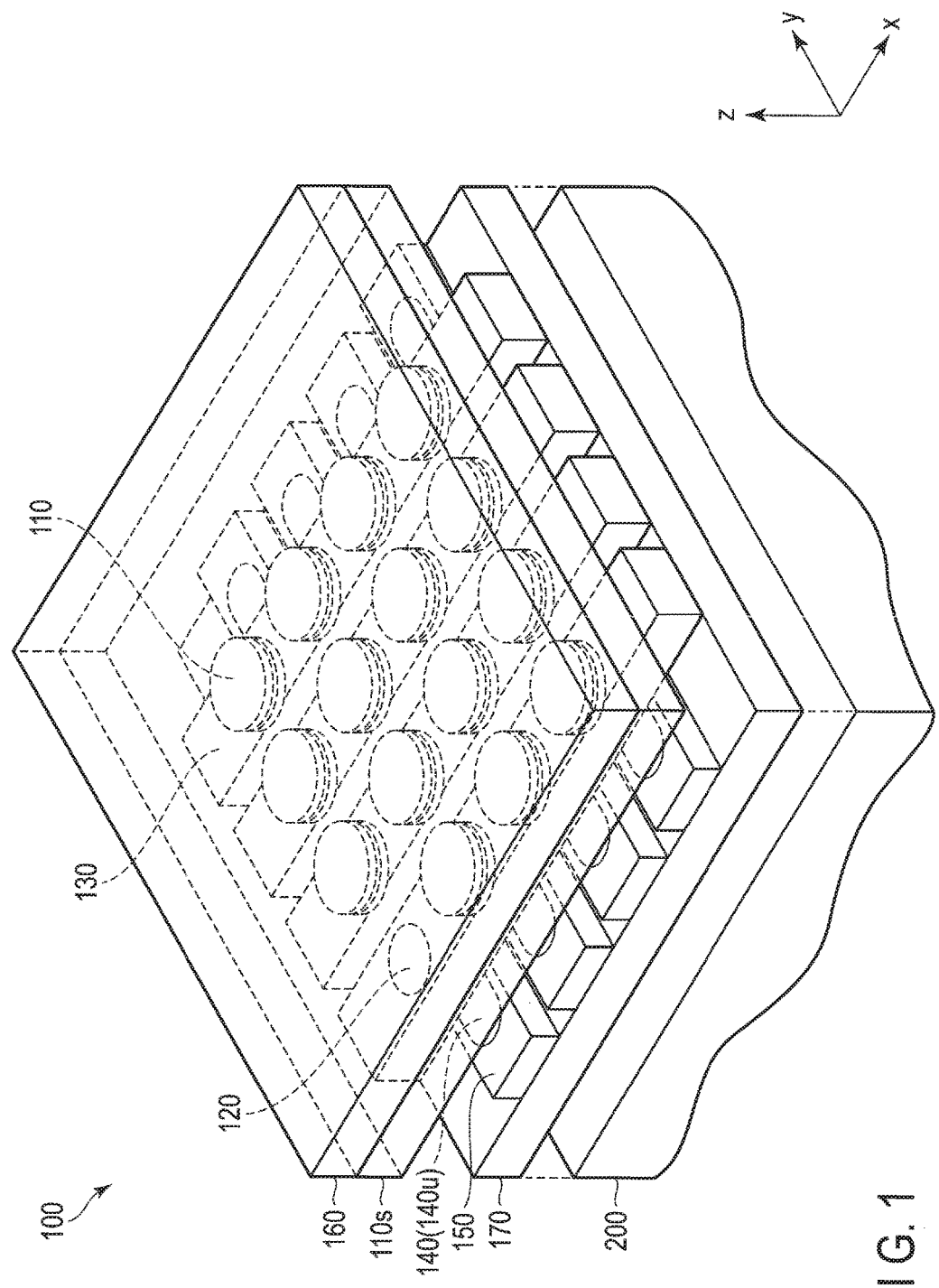
FIG. 1 schematically shows the structure of a magnetic memory device (semiconductor integrated circuit device) according to an embodiment.
Figure 2:
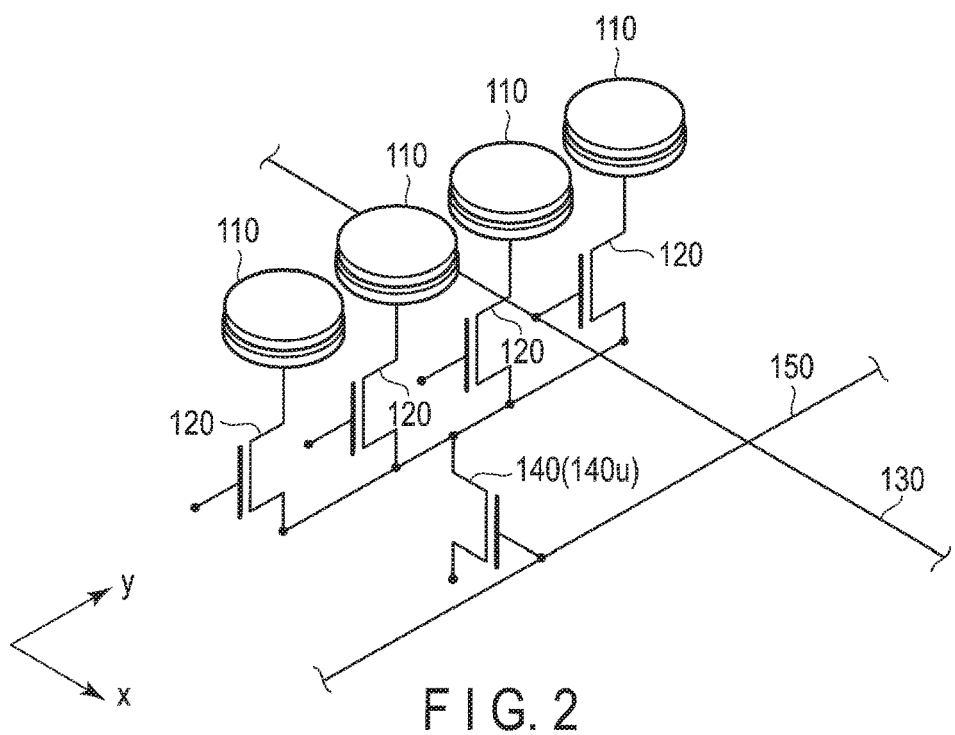
FIG. 2 schematically shows the electrical connection of structural elements included in a memory cell array unit according to the embodiment.

FIG. 1 schematically shows the structure of a magnetic memory device (semiconductor integrated circuit device) according to an embodiment, specifically, the structure of a memory cell array unit included in a magnetic memory device. FIG. 2 schematically shows the electrical connection of structural elements included in the memory cell array unit shown in FIG. 1.

As shown in FIG. 1, a memory cell array unit 100 is provided on a semiconductor substrate (for example, a silicon substrate) 200. Each memory cell included in the memory cell array unit 100 of the present embodiment has a cell size of $4F^2$ ($=2F \times 2F$).

The memory cell array unit 100 includes a plurality of magnetoresistive elements 110, a plurality of first transistors (MOS transistors) 120, a plurality of first word lines 130, a plurality of switching units 140u each including at least one second transistor (MOS transistor) 140, a plurality of second word lines 150, a first plate electrode 160 and a second plate electrode 170. As described later, an upper stacked layer structure 110s including the reference layer and the shift canceling layer of each magnetoresistive element 110 is continuously provided in an x-direction and a y-direction. The layer including the first transistors 120 is located between the layer including the magnetoresistive elements 110 and the layer including the switching units 140u.

The magnetoresistive elements 110 are provided in an array form in the x-direction (first direction) and the y-direction (second direction). The x-direction (first direction) is perpendicular to the y-direction (second direction). Each magnetoresistive element 110 is a spin-transfer-torque (STT) magnetoresistive element having perpendicular magnetization. Each magnetoresistive element 110 is also called a magnetic-tunnel-junction (MTJ) element.

The transistors (first transistors) 120 are provided in an array form in the x-direction (first direction) and the y-direction (second direction) so as to correspond to the magnetoresistive elements 110. Specifically, each transistor 120 is provided immediately under a corresponding magnetoresistive element 110, and is connected to the magnetoresistive element 110.

Each word line (first word line) 130 extends in the x-direction (first direction), and selects corresponding transistors 120. In other words, each word line 130 selects corresponding transistors 120 arranged in the x-direction. The word lines 130 are partially used as the gate electrodes of the transistors 120.

Each switching unit 140u includes at least one transistor (second transistor) 140. In the example shown in FIG. 1 and FIG. 2, each switching unit 140u comprises a single transistor 140. Each switching unit 140u is connected to each of corresponding transistors 120 arranged in the y-direction (second direction) in series.

Each word line (second word line) 150 extends in the y-direction (second direction), and selects a corresponding switching unit 140u. In other words, each word line 150 selects a corresponding switching unit 140u extending in the y-direction. The word lines 150 are partially used as the gate electrodes of the transistors 140 included in the switching units 140u.

The plate electrode (first plate electrode) 160 is electrically connected to the magnetoresistive elements 110, and is continuously provided in the x-direction (first direction) and the y-direction (second direction). Thus, the plate electrode 160 functions as a common electrode for all of the magnetoresistive elements 110 included in the memory cell array unit 100. Specifically, the plate electrode 160 functions as a single bit plate having commonality of a plurality of bit lines. For the conductive material of the plate electrode 160, for example, a metal material such as tungsten (W) or copper (Cu), or polycrystalline silicon doped with impurities is used.

The plate electrode (second plate electrode) 170 is electrically connected to the switching units 140u, and is continuously provided in the x-direction (first direction) and the y-direction (second direction). Thus, the plate electrode 170 functions as a common electrode for all of the switching units 140u included in the memory cell array unit 100. Specifically, the plate electrode 170 functions as a single source plate having commonality of a plurality of source lines. For the conductive material of the plate electrode 170, for example, a metal material such as tungsten (W) or copper (Cu), or polycrystalline silicon doped with impurities is used.

Figure 3:
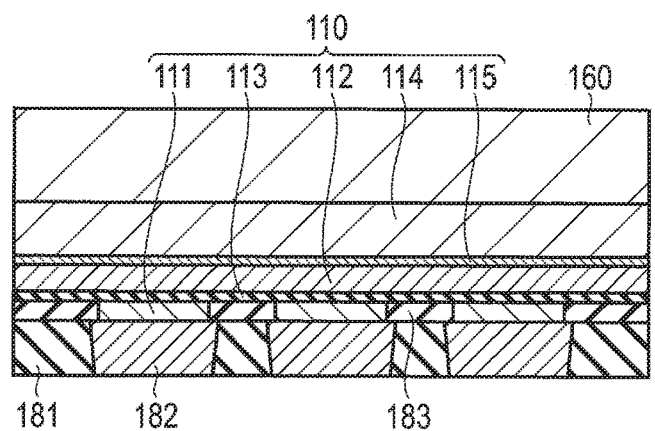
FIG. 3 is a schematic cross-sectional view mainly showing a first structural example of magnetoresistive elements according to the embodiment.

FIG. 3 is a schematic cross-sectional view mainly showing a first structural example of the magnetoresistive elements 110.

As shown in FIG. 3, each magnetoresistive element 110 includes a storage layer (first magnetic layer) 111, a reference layer (second magnetic layer) 112, a tunnel barrier layer (nonmagnetic layer) 113, a shift canceling layer (third magnetic layer) 114 and an intermediate layer 115. The tunnel barrier layer 113 is provided between the storage layer 111 and the reference layer 112. The reference layer 112 is provided between the shift canceling layer 114 and the tunnel barrier layer 113. The intermediate layer 115 is provided between the reference layer 112 and the shift canceling layer 114.

The storage layer (first magnetic layer) 111 is provided on a bottom electrode 182 included in an interlayer insulating film 181, and is electrically connected to the transistor 120 (see FIG. 1) by the bottom electrode 182. The storage layer 111 has a variable magnetization direction. Specifically, the storage layer 111 can have two magnetization directions perpendicular to its main surface. The two magnetization directions are opposite to each other. The storage layer 111 contains at least iron (Fe) and boron (B). The storage layer 111 may contain cobalt (Co) in addition to iron (Fe) and boron (B). In the present embodiment, the storage layer 111 is formed of CoFeB. An underlayer and a buffer layer may be provided between the storage layer 111 and the bottom electrode 182.

The reference layer (second magnetic layer) 112 has a fixed magnetization direction. Specifically, the reference layer 112 has a magnetization direction perpendicular to its main surface. The reference layer 112 includes a lower part on the storage layer 111 side, and an upper part on the shift canceling layer 114 side. The lower part contains at least iron (Fe) and boron (B). The lower part may contain cobalt (Co) in addition to iron (Fe) and boron (B). In the present embodiment, the lower part is formed of CoFeB. The upper part contains cobalt (Co), and at least one element selected from platinum (Pt), nickel (Ni) and palladium (Pd). Specifically, the upper part is formed of CoPt, CoNi or CoPd. An intermediate layer formed of tantalum (Ta), etc., may be provided between the lower part and the upper part.

The tunnel barrier layer (nonmagnetic layer) 113 is formed of an insulating material. For example, the tunnel barrier layer 113 contains magnesium (Mg) and oxygen (O). In the present embodiment, the tunnel barrier layer 113 is formed of MgO.

The shift canceling layer (third magnetic layer) 114 has a magnetization direction anti-parallel to the magnetization direction of the reference layer. The shift canceling layer 114 contains cobalt (Co), and at least one element selected from platinum (Pt), nickel (Ni) and palladium (Pd). Specifically, the shift canceling layer 114 is formed of CoPt, CoNi or CoPd. The shift canceling layer 114 is allowed to cancel the magnetic field applied from the reference layer 112 to the storage layer 111.

The intermediate layer 115 is formed of ruthenium (Ru), etc., and is interposed between the reference layer 112 and the shift canceling layer 114.

The resistance of the above magnetoresistive element 110 when the magnetization direction of the storage layer 111 is parallel to the magnetization direction of the reference layer 112 is less than that when the magnetization direction of the storage layer 111 is anti-parallel to the magnetization direction of the reference layer 112. When the magnetization direction of the storage layer 111 is parallel to that of the reference layer 112, the magnetoresistive element 110 is in a low resistive state. When the magnetization direction of the storage layer 111 is anti-parallel to that of the reference layer 112, the magnetoresistive element 110 is in a high resistive state. In this way, the magnetoresistive element 110 is capable of storing a binary value (0 or 1) based on the resistive state (a low or high resistive state). The resistive state (a low or high resistive state) of the magnetoresistive element 110 may be set based on the direction of write current flowing in the magnetoresistive element 110.

In the present embodiment, as shown in FIG. 1 and FIG. 3, the storage layers 111 included in the magnetoresistive elements 110 are separated from each other in the x-direction and the y-direction. As shown in FIG. 3, an insulating layer 183 is provided in the region between adjacent storage layers 111, and separates the storage layers 111 from each other.

The reference layer 112 included in the magnetoresistive elements 110 is continuously provided in the x-direction and the y-direction. Thus, the reference layer 112 is provided like a plate as a continuous film in the single memory cell array unit 100. Similarly, the shift canceling layer 114 and the intermediate layer 115 are continuously provided in the x-direction and the y-direction. Thus, in the single memory cell array unit 100, the shift canceling layer 114 is provided like a plate as a continuous film, and the intermediate layer 115 is provided like a plate as a continuous film. In the present embodiment, an upper stacked layer structure including the reference layer 112, the shift canceling layer 114 and the intermediate layer 115 is continuously provided in the x-direction and the y-direction. In the example shown in FIG. 3, the tunnel barrier layer 113 included in the magnetoresistive elements 110 is also continuously provided in the x-direction and the y-direction.

Figure 4:
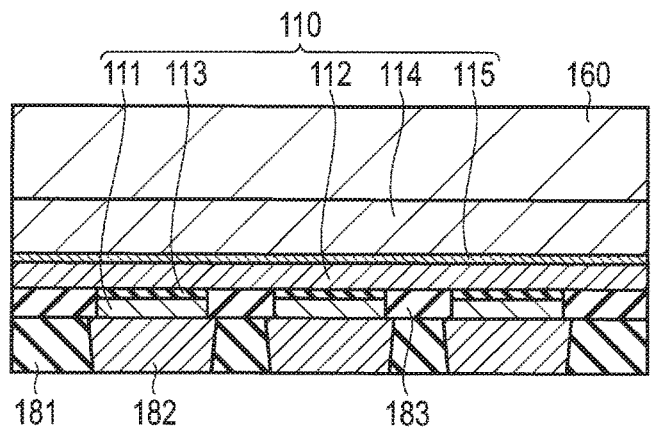
FIG. 4 is a schematic cross-sectional view mainly showing a second structural example of the magnetoresistive elements according to the embodiment.

FIG. 4 is a schematic cross-sectional view mainly showing a second structural example of the magnetoresistive elements 110. In this structural example, the tunnel barrier layers 113 included in the magnetoresistive elements 110 are separated from each other in the x-direction and the y-direction. The other basic structures are the same as those of the first structural example.

Figure 5:
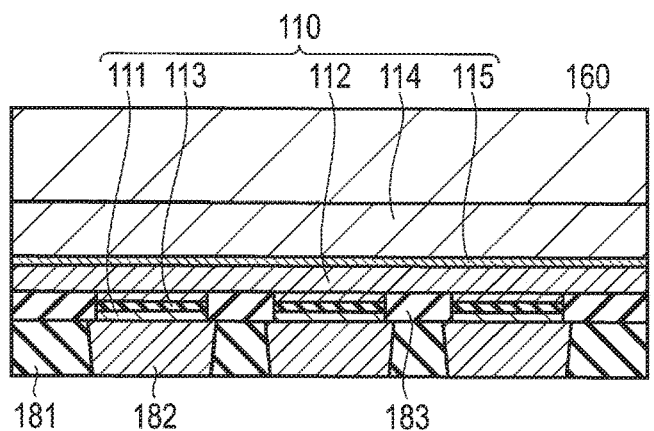
FIG. 5 is a schematic cross-sectional view mainly showing a third structural example of the magnetoresistive elements according to the embodiment.

FIG. 5 is a schematic cross-sectional view mainly showing a third structural example of the magnetoresistive elements 110. In this structural example, the tunnel barrier layers 113 included in the magnetoresistive elements 110 are separated from each other in the x-direction and the y-direction in a manner similar to that of the above example. Further, in the present example, a part (for example, the lower part) of the reference layer 112 conforms to the pattern of the storage layers 111. The other basic structures are the same as those of the first structural example.

Figure 6:
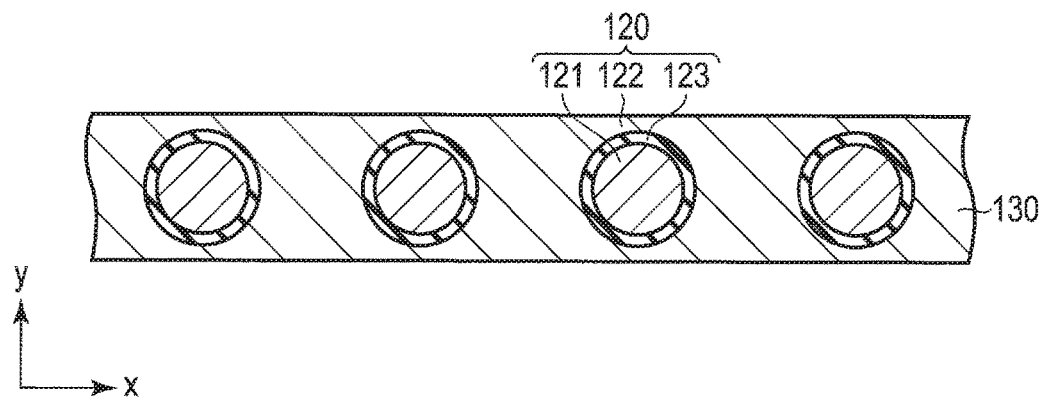
FIG. 6 is a plan view schematically showing the structures of first transistors and a first word line according to the embodiment.
Figure 7:
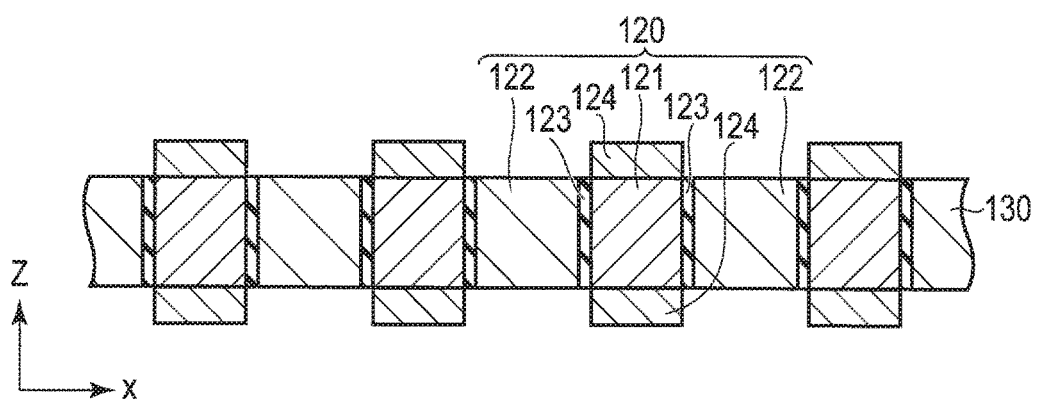
FIG. 7 is a cross-sectional view schematically showing the structures of the first transistors and the first word line according to the embodiment.

FIG. 6 is a plan view schematically showing the structures of the first transistors 120 and the first word line 130. FIG. 7 is a cross-sectional view schematically showing the structures of the first transistors 120 and the first word line 130 (specifically, a cross-sectional view perpendicular to the y-direction of FIG. 1).

As shown in FIG. 6 and FIG. 7, each first transistor 120 includes a semiconductor portion 121 which forms a channel, a gate electrode 122 which surrounds the semiconductor portion 121, a gate insulating layer 123 provided between the semiconductor portion 121 and the gate electrode 122, and a source/drain portion 124 provided at each of two ends of the semiconductor portion 121. The gate electrode 122 is used as a part of the word line 130. The semiconductor portion 121 has a channel length direction in a z-direction perpendicular to the x-direction and the y-direction. Thus, the first transistor 120 has a current pathway in a direction perpendicular to the main surface of the semiconductor substrate 200 (see FIG. 1).

Figure 8:
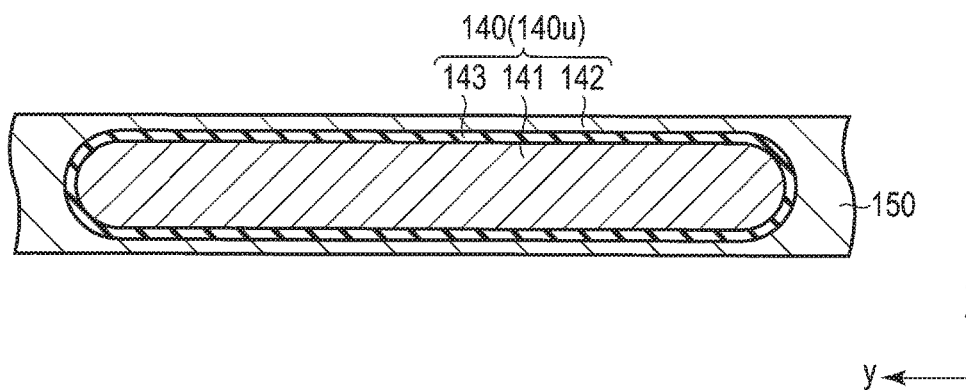
FIG. 8 is a plan view schematically showing the structures of a second transistor (switching unit) and a second word line according to the embodiment.
Figure 9:
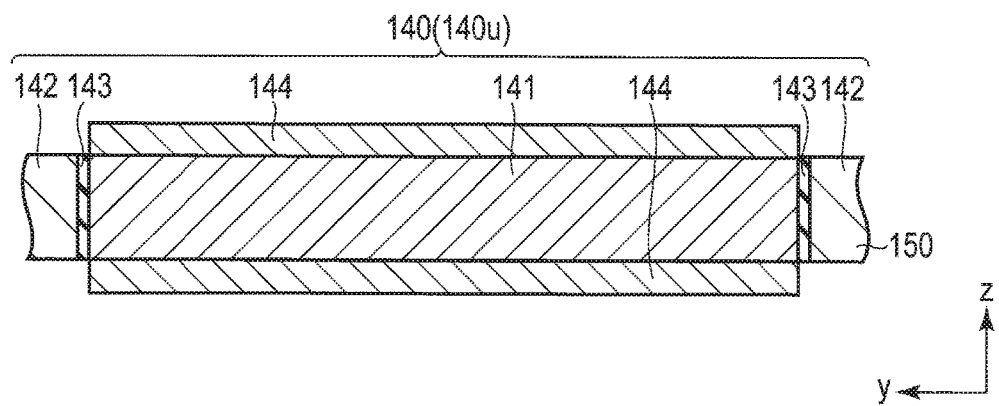
FIG. 9 is a cross-sectional view schematically showing the structures of the second transistor (switching unit) and the second word line according to the embodiment.

FIG. 8 is a plan view schematically showing the structures of the second transistor 140 (the switching unit 140*u*) and the second word line 150. FIG. 9 is a cross-sectional view schematically showing the structures of the second transistor 140 (the switching unit 140*u*) and the second word line 150 (specifically, a cross-sectional view perpendicular to the x-direction of FIG. 1).

As shown in FIG. 8 and FIG. 9, the second transistor 140 includes a semiconductor portion 141 which forms a channel, a gate electrode 142 which surrounds the semiconductor portion 141, a gate insulating layer 143 provided between the semiconductor portion 141 and the gate electrode 142, and a source/drain portion 144 provided at each of two ends of the semiconductor portion 141. The gate electrode 142 is used as a part of the word line 150. The semiconductor portion 141 has a channel length direction in a z-direction perpendicular to the x-direction and the y-direction. Thus, the second transistor 140 has a current pathway in a direction perpendicular to the main surface of the semiconductor substrate 200 (see FIG. 1). In the present embodiment, each switching unit 140*u* comprises a single second transistor 140. In this manner, as shown in FIG. 8 and FIG. 9, the second transistor 140 is large in the channel width.

As is clear from the above description, in the magnetic memory device of the present embodiment, the first transistor 120 and the second transistor 140 (switching hit 140*u*) are connected to a corresponding magnetoresistive element 110 in series. A desired magnetoresistive element 110 can be selected by turning on the first and second transistors 120 and 140 connected to the desired magnetoresistive element 110 in series. Thus, writing and reading can be performed for the desired magnetoresistive element 110 by selecting the word line 130 connected to the first transistor 120 to be turned on and selecting the word line 150 connected to the second transistor 140 to be turned on.

As explained above, in the magnetic memory device of the present embodiment, the storage layers 111 are separated from each other in the x-direction and the y-direction. However, the reference layer 112 is continuously provided in the x-direction and the y-direction. Thus, the distribution of the magnetic field generated from the reference layer 112 can be uniform. The characteristics of the magnetoresistive elements 110 can be improved. Since the shift canceling layer 114 is also continuously provided in the x-direction and the y-direction, the distribution of the magnetic field generated from the shift canceling layer 114 can be uniform. The characteristics of the magnetoresistive elements 110 can be improved.

In the magnetic memory device of the present embodiment, the upper stacked layer structure including the reference layer 112, the shift canceling layer 114 and the intermediate layer 115 is continuously provided in the x-direction and the y-direction. When the upper stacked layer structure is independent, high anti-ferromagnetic coupling Jex is required in connection with scaling. However, the magnetic memory device of the present embodiment has the continuous upper stacked layer structure. Therefore, the present embodiment does not require high anti-ferromagnetic coupling Jex.

In the magnetic memory device of the present embodiment, the first plate electrode 160 functioning as a bit plate is continuously provided in the x-direction and the y-direction in addition to the above upper stacked layer structure. Similarly, the second plate 170 functioning as a source plate is continuously provided in the x-direction and the y-direction. Thus, the resistance of the current pathway to the memory cells can be low. The write current can be increased. Further, the characteristics of heat radiation of elements can be improved. Since plate electrodes are used, it is possible to reduce the accuracy of alignment between each magnetoresistive element 110 and the first and second plate electrodes 160 and 170.

The magnetic memory device of the present embodiment can realize a cell size of $4F^2$ ($=2F \times 2F$). Thus, the area of each cell can be reduced.

Figure 10:
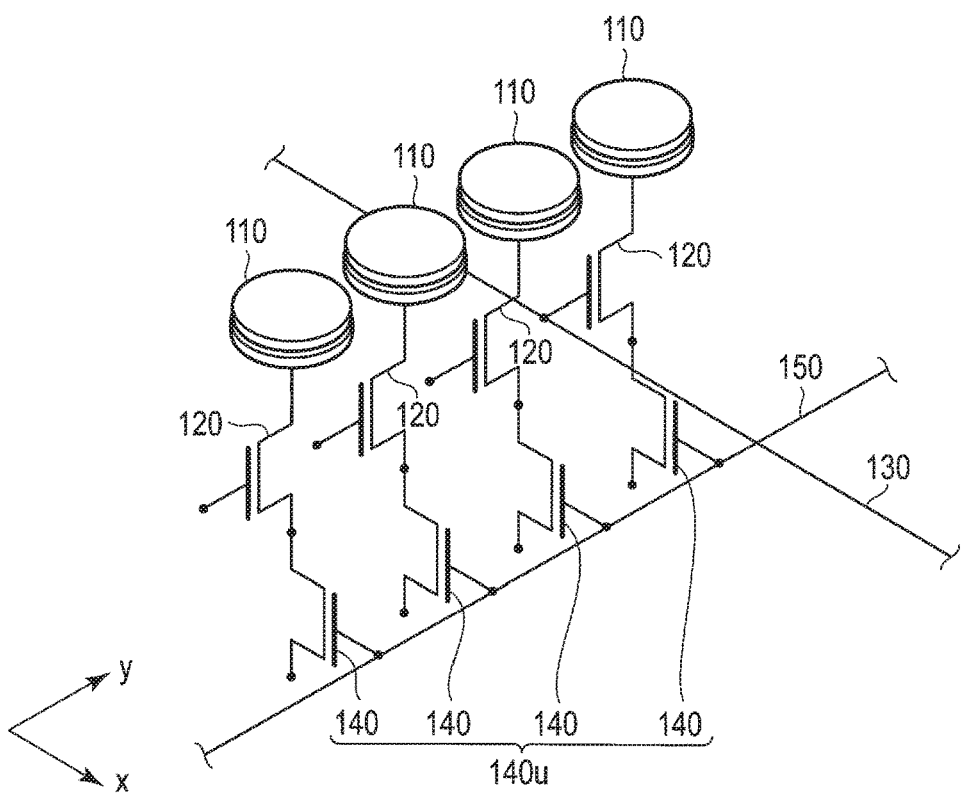
FIG. 10 schematically shows the electrical connection of structural elements included in the memory cell array unit according to a modification example of the embodiment.
Figure 11:
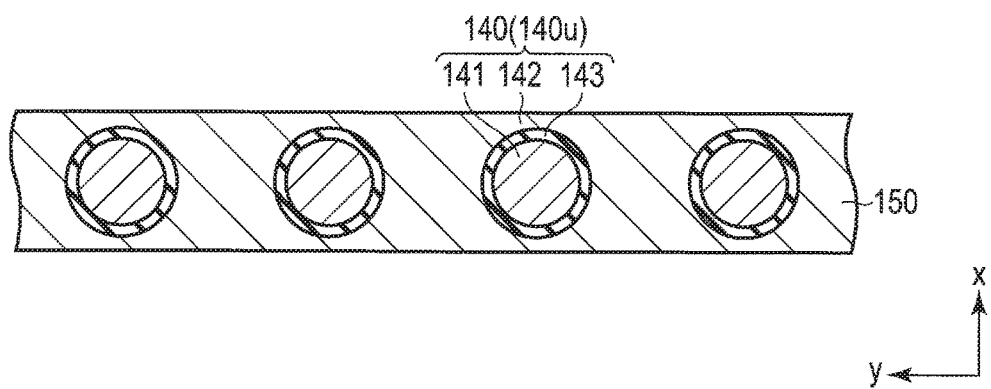
FIG. 11 is a plan view schematically showing the structures of the second transistors (switching units) and the second word line according to a modification example of the embodiment.
Figure 12:
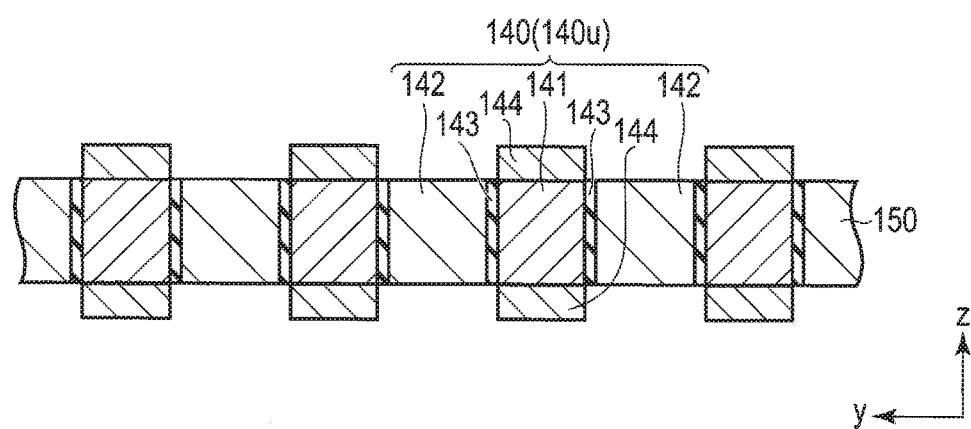
FIG. 12 is a cross-sectional view schematically showing the structures of the second transistors (switching units) and the second word line according to the modification example of the embodiment.

FIG. 10 shows a modification example of the memory cell array unit included in the magnetic memory device of the present embodiment. Specifically, FIG. 10 schematically shows the electrical connection of structural elements included in the memory cell array unit. FIG. 11 is a plan view schematically showing the structures of the second transistors 140 (switching units 140*u*) and the second word line 150 in this modification example. FIG. 12 is a cross-sectional view schematically showing the structures of the second transistors 140 (switching units 140*u*) and the second word line 150 in this modification example. Since the basic matters are the same as those of the above embodiment, the explanation thereof is omitted.

In the above embodiment, as shown in FIG. 1 and FIG. 2, each switching unit 140*u* comprises a single transistor (second transistor) 140. However, in this modification example, each switching unit 140*u* comprises a plurality of transistors 140. Specifically, the transistors 140 included in each switching unit 140*u* are connected to respective corresponding transistors (first transistors) 120 arranged in the same direction (y-direction) as the arrangement direction (y-direction) of the transistors 140 in series.

In the present modification example, each magnetoresistive element 110 is connected to a corresponding first transistor 120 and a corresponding second transistor 140 in series. Thus, a desired magneto resistive element 110 can be selected by turning on both the first transistor 120 and the second transistor 140 connected to the desired magnetoresistive element 110 in series. In other words, writing and reading can be performed for the desired magnetoresistive element 110 by selecting the word line 130 connected to the first transistor 120 to be turned on and selecting the word line 150 connected to the second transistor 140 to be turned on.

Now, this specification explains a first manufacturing method of the magnetic memory device of the present embodiment. FIG. 13 to FIG. 18 are cross-sectional views schematically showing the first manufacturing method.

A lower structure (not shown) is formed on the semiconductor substrate (not shown). Specifically, as shown in FIG. 1, a lower structure including the second plate electrode 170, the second transistors 140 (switching units 140*u*), the second word lines 150, the first transistors 120 and the first word lines 130 is formed on the semiconductor substrate 200.

Figure 13:
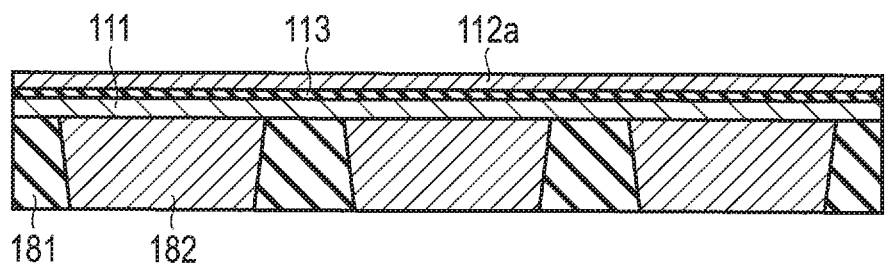
FIG. 13 is a cross-sectional view schematically showing a part of a first manufacturing method of the magnetic memory device of the embodiment.

Subsequently, as shown in FIG. 13, the interlayer insulating films 181 and the bottom electrodes 182 are formed on the lower structure. Subsequently, a stacked film including the storage layer 111, the tunnel barrier layer 113 and the lower part 112*a* of the reference layer 112 is formed on the interlayer insulating films 181 and the bottom electrodes 182. A nonmagnetic layer formed of, for example, tantalum (Ta), zirconium (Zr), tungsten (W), hafnium (Hf), molybdenum (Mo), niobium (Nb), titanium (Ti), vanadium (V) or chromium (Cr) may be provided on the lower part 112*a* of the reference layer 112.

Figure 14:
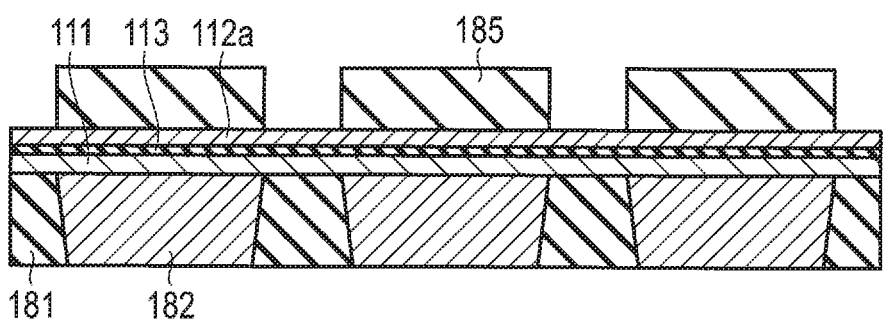
FIG. 14 is a cross-sectional view schematically showing a part of the first manufacturing method of the magnetic memory device of the embodiment.

Subsequently, as shown in FIG. 14, a mask pattern 185 is formed on the above stacked film. For the material of the mask pattern 185, silicon oxide or silicon nitride can be used. For the material of the mask pattern 185, an organic material may be used.

Figure 15:
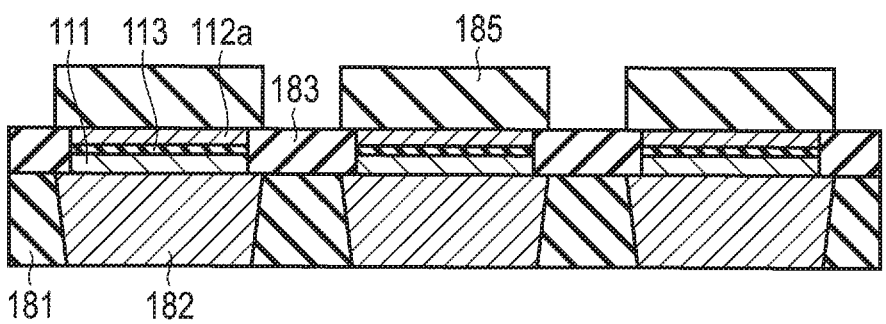
FIG. 15 is a cross-sectional view schematically showing a part of the first manufacturing method of the magnetic memory device of the embodiment.

Subsequently, as shown in FIG. 15, the mask pattern 185 is used as a mask to oxidize the above stacked film. Specifically, plasma oxidation or radical oxidation is employed. By this oxidation process, oxidized films are formed as the insulating films 183. In particular, when noble metal is not used for the stacked film, oxidized films can be effectively formed.

Subsequently, as shown in FIG. 16, the mask pattern 185 is removed by dry etching or wet etching.

Subsequently, as shown in FIG. 17, the upper part 112b of the reference layer 112, the intermediate layer 115 and the shift canceling layer 114 are formed on the structure obtained by the process of FIG. 16. Further, the plate electrode film 160 is formed on the shift canceling layer 114.

Subsequently, as shown in FIG. 18, a mask pattern (not shown) is used as a mask to etch the plate electrode film 160, etc. In this way, the structure shown in FIG. 18 is obtained.

Figure 19:
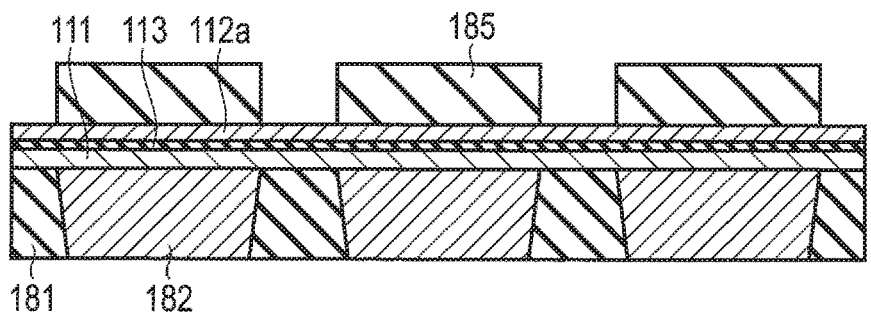
FIG. 19 is a cross-sectional view schematically showing a part of a second manufacturing method of the magnetic memory device of the embodiment.
Figure 20:
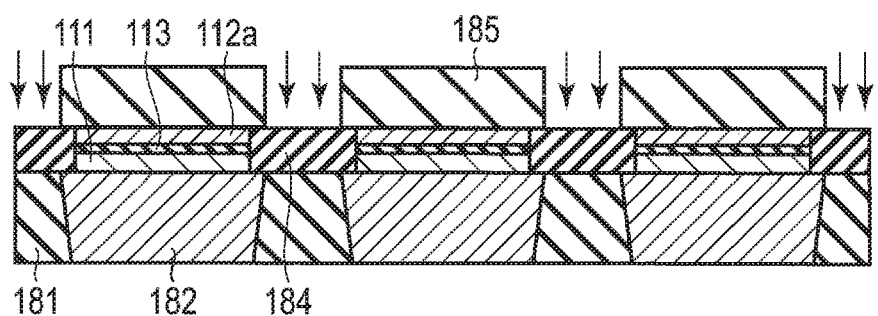
FIG. 20 is a cross-sectional view schematically showing a part of the second manufacturing method of the magnetic memory device of the embodiment.
Figure 21:
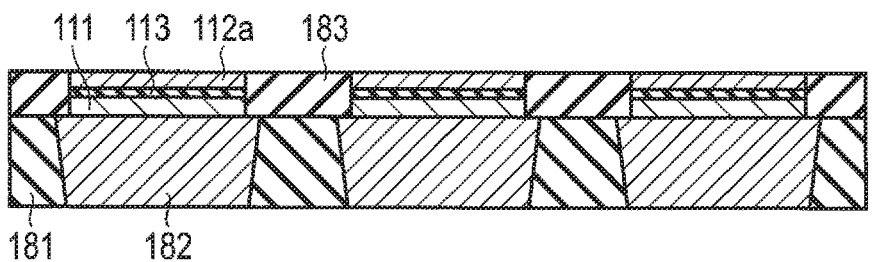
FIG. 21 is a cross-sectional view schematically showing a part of the second manufacturing method of the magnetic memory device of the embodiment.

Now, this specification explains a second manufacturing method of the magnetic memory device of the present embodiment, referring to FIG. 19 to FIG. 21. Since the basic matters are the same as those of the first manufacturing method, the explanation thereof is omitted.

The steps of FIG. 13 and FIG. 14 of the first manufacturing method are performed. Thus, the structure shown in FIG. 19 obtained.

Subsequently, as shown in FIG. 20, the mask pattern 185 is used as a mask to implant oxygen ions into the stacked film (specifically, the storage layer 111, the tunnel barrier layer 113 and the lower part 112a of the reference layer 112).

Subsequently, as shown in FIG. 21, an annealing process is applied. Thus, the portions doped with oxygen ions are transformed into oxidized films. In this way, the insulating films 183 are formed.

The subsequent steps are the same as the steps of FIG. 17 and FIG. 18 of the first manufacturing method. Thus, the same structure as FIG. 18 of the first embodiment is obtained.

Now, this specification explains a third manufacturing method of the magnetic memory device of the present embodiment, referring to FIG. 22 to FIG. 27. Since the basic matters are the same as those of the first manufacturing method, the explanation thereof is omitted.

Figure 22:
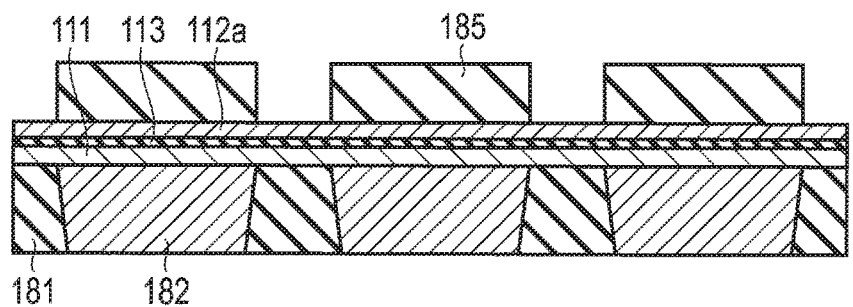
FIG. 22 is a cross-sectional view schematically showing a part of a third manufacturing method of the magnetic memory device of the embodiment.
Figure 23:
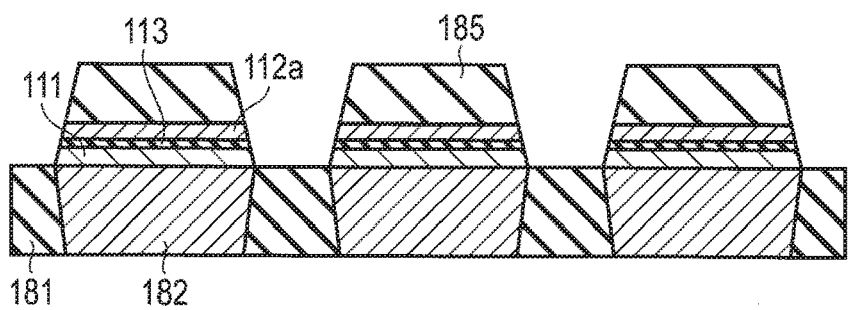
FIG. 23 is a cross-sectional view schematically showing a part of the third manufacturing method of the magnetic memory device of the embodiment.

The steps of FIG. 13 and FIG. 14 of the first manufacturing method are performed. Thus, the structure shown in FIG. 22 is obtained.

Subsequently, the mask pattern 185 is used as a mask to etch the stacked film (specifically, the storage layer 111, the tunnel barrier layer 113 and the lower part 112a of the reference layer 112) by ion beam etching (IBE).

Figure 24:
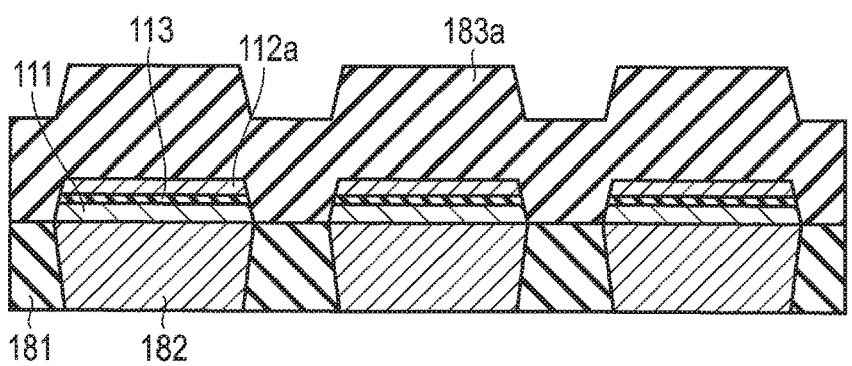
FIG. 24 is a cross-sectional view schematically showing a part of the third manufacturing method of the magnetic memory device of the embodiment.

As shown in FIG. 24, after the mask pattern 185 is removed, an insulating film 183a is formed on the entire surface.

Figure 25:
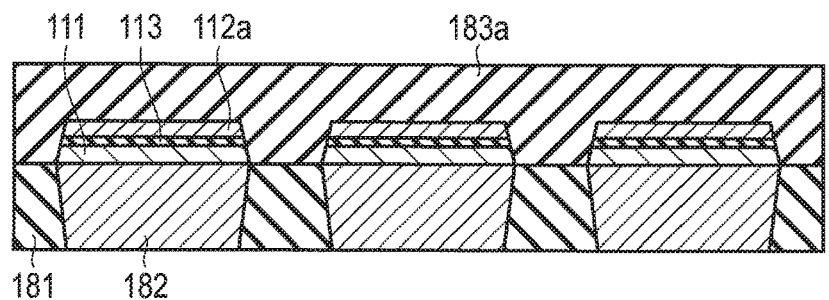
FIG. 25 is a cross-sectional view schematically showing a part of the third manufacturing method of the magnetic memory device of the embodiment.

Subsequently, as shown in FIG. 25, the insulating film 183a is planarized by chemical mechanical polishing (CMP).

Figure 26:
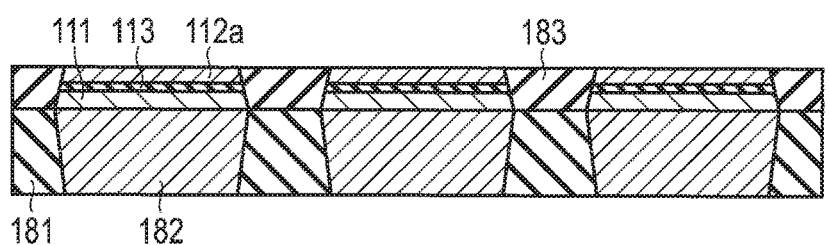
FIG. 26 is a cross-sectional view schematically showing a part of the third manufacturing method of the magnetic memory device of the embodiment.

Subsequently, as shown in FIG. 26, the insulating film 183a provided above the stacked film (specifically, the storage layers 111, the tunnel barrier layers 113 and the lower portions 112a of the reference layer 112) is removed by wet etching. As a result, a structure in which each stacked film is surrounded by the insulating films 183 is obtained.

Figure 27:
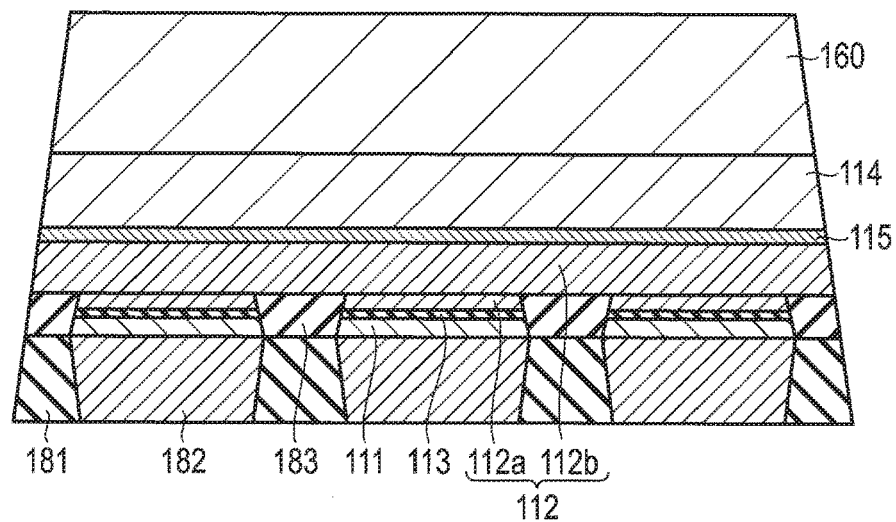
FIG. 27 is a cross-sectional view schematically showing a part of the third manufacturing method of the magnetic memory device of the embodiment.

The subsequent steps are the same as the steps of FIG. 17 and FIG. 18 of the first manufacturing method. In this way, the structure shown in FIG. 27 is obtained.

Now, this specification explains various examples of the stacked layer structure of the magnetic memory device of the present embodiment.

Figure 28:
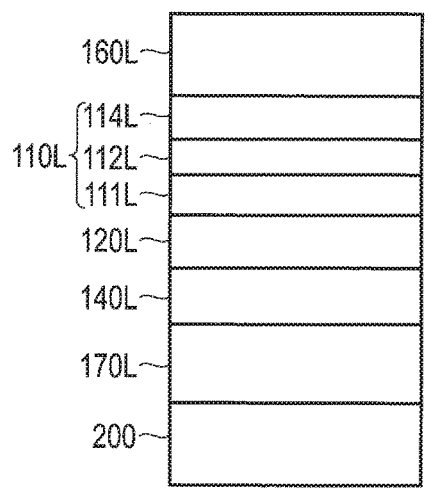
FIG. 28 schematically shows the concept of a first example of the stacked layer structure of the magnetic memory device of the embodiment.

FIG. 28 schematically shows the concept of a first example of the stacked layer structure of the magnetic memory device of the present embodiment. In this example, the same stacked layer structure (stacked order) as the above embodiment is employed. In the present example, a layer 170L including the second plate electrode (source plate), a layer 140L including the second transistors, a layer 120L including the first transistors, a layer 110L (specifically, a storage layer 111L, a reference layer 112L and a shift canceling layer 114L) including the magnetoresistive elements, and a layer 160L including the first plate electrode (bit plate) are formed on the semiconductor substrate 200 in this order. Thus, the layer 120L including the first transistors and the layer 140L including the second transistors (in other words, the layer including the switching units) are provided between the layer 110L including the magnetoresistive elements and the semiconductor substrate 200.

Figure 29:
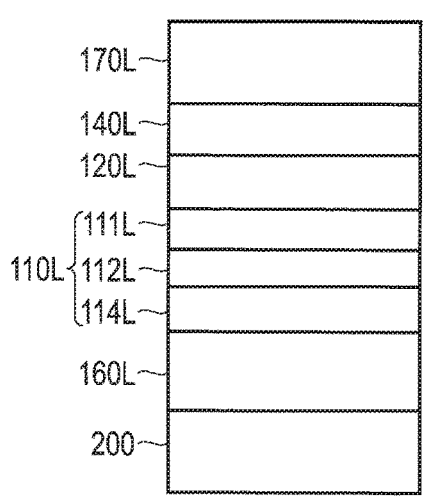
FIG. 29 schematically shows the concept of a second example of the stacked layer structure of the magnetic memory device of the embodiment.

FIG. 29 schematically shows the concept of a second example of the stacked layer structure of the magnetic memory device of the present embodiment. In this example, the layer 160L including the first plate electrode (bit plate), the layer 110L (specifically, the shift canceling layer 114L, the reference layer 112L and the storage layer 111L) including the magnetoresistive elements, the layer 120L including the first transistors, the layer 140L including the second transistors, and the layer 170L including the second plate electrode (source plate) are formed on the semiconductor substrate 200 in this order. Thus, the layer including the magnetoresistive elements 110L is provided between the layer 120L including the first transistors and the semiconductor substrate 200.

Figure 30:
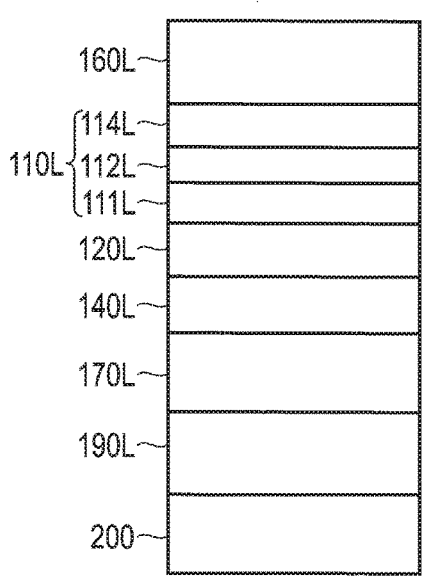
FIG. 30 schematically shows the concept of a third example of the stacked layer structure of the magnetic memory device of the embodiment.

FIG. 30 schematically shows the concept of a third example of the stacked layer structure of the magnetic memory device of the present embodiment. In this example, a layer 190L including a peripheral circuit is further provided between the semiconductor substrate 200 and the layer 110L including the magnetoresistive elements, the layer 120L including the first transistors and the layer 140L including the second transistors (in other words, the layer including the switching units). More specifically, the layer 190L including a peripheral circuit is provided between the semiconductor substrate 200 and the layer 170L including the second plate electrode (source plate). By this structure, the circuit area can be reduced as a whole.

Figure 31:
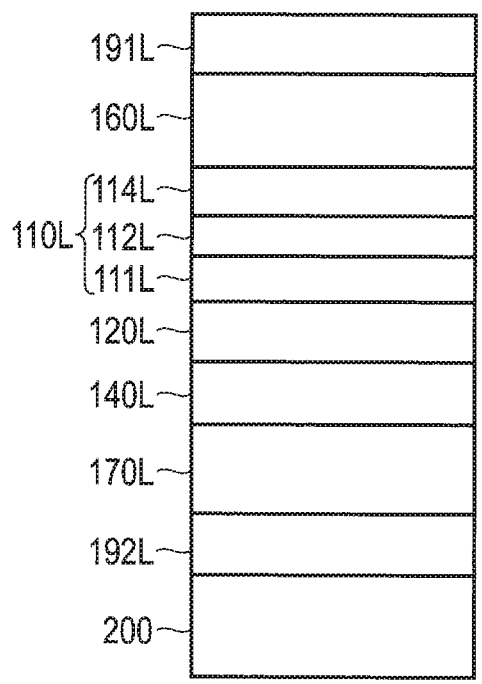
FIG. 31 schematically shows the concept of a fourth example of the stacked layer structure of the magnetic memory device of the embodiment.

FIG. 31 schematically shows the concept of a fourth example of the stacked layer structure of the magnetic memory device of the present embodiment. In this example, a first magnetic shield layer 191L and a second magnetic shield layer 192L are provided so as to interpose the layer 110L including the magnetoresistive elements, the layer 120L including the first transistors and the layer 140L including the second transistors (in other words, the layer including the switching units) between the first magnetic shield layer 191L and the second magnetic shield layer 192L. More specifically, the first magnetic shield layer 191L is provided on the layer 160L including the first plate electrode (bit plate). The second magnet shield layer 192L is provided between the semiconductor substrate 200 and the layer 170L including the second plate electrode (source plate). The first magnetic shield layer 191L may not be provided. Instead of it, the first plate electrode 160 may have the function of a magnetic shield layer. Similarly, the second magnetic shield layer 192L may not be provided. Instead of it, the second plate electrode 170 may have the function of a magnetic shield layer.

Figure 32:
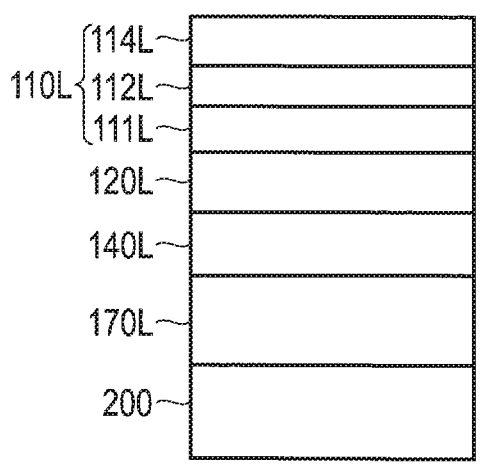
FIG. 32 schematically shows the concept of a fifth example of the stacked layer structure of the magnetic memory device of the embodiment.

FIG. 32 schematically shows the concept of a fifth example of the stacked layer structure of the magnetic memory device of the present embodiment. In this example, the first plate electrode (bit plate) is not provided on the layer 110L including the magnetoresistive elements. The reference layer 112 and the shift canceling layer 114 function as a plate electrode. Since the reference layer 112 and the shift canceling layer 114 are continuously formed in the x-direction and the y-direction, the reference layer 112 and the shift canceling layer 114 are allowed to function as a plate electrode (bit plate).

Figure 33:
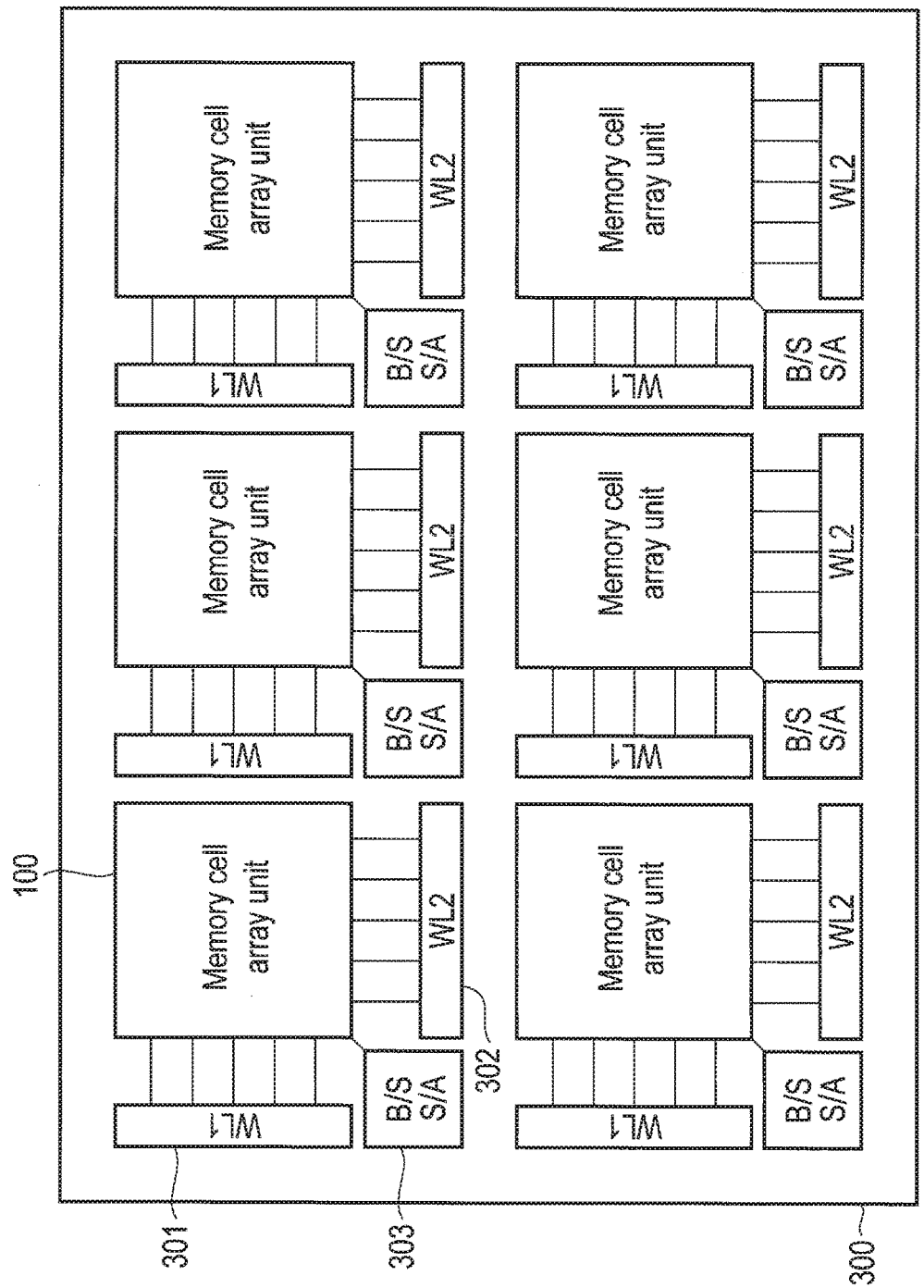
FIG. 33 is a block diagram showing a first structural example of a magnetic memory device (semiconductor integrated circuit device) comprising a plurality of memory cell array units according to the embodiment.

FIG. 33 is a block diagram showing a first structural example of a magnetic memory device (semiconductor integrated circuit device) comprising a plurality of memory cell array units 100.

As shown in FIG. 33, a plurality of memory cell array units 100 are provided in a single semiconductor integrated circuit device (IC chip) 300. Each memory cell array unit 100 is connected to a corresponding first word line driver 301, a corresponding second word line driver 302 and a corresponding sense amplifier 303.

As described above, a plurality of memory cell array units 100 are provided in a single semiconductor integrated circuit device (IC chip) 300. Thus, it is possible to control writing and reading for each memory cell array unit 100.

In the case of writing, data can be simultaneously written to a plurality of memory cell array units 100. Further, writing can be performed for each magnetoresistive element included in a desired memory cell array unit 100. It is also possible to write 0 or 1 to all of the magnetoresistive elements included in a desired memory cell array unit 100 in block. Since a single common bit plate and a single common source plate are provided in a single memory cell array unit 100, 0 or 1 can be written to all of the magnetoresistive elements included in a desired memory cell array unit 100 in block by turning on all of the first and second word lines included in the desired memory cell array unit 100.

Similarly, in the case of reading, since the memory cell array units 100 comprises their respective sense amplifiers 303, data can be simultaneously read from the memory cell array units 100 by simultaneously activating the sense amplifiers 303.

FIG. 34 is a block diagram showing a second structural example of a magnetic memory device (semiconductor integrated circuit device) comprising a plurality of memory cell array units 100.

Similarly, in the second structural example, a plurality of memory cell array units 100 are provided in a single semiconductor integrated circuit device (IC chip) 300. Each memory cell array unit 100 is connected to a corresponding sense amplifier 303. Note that, in the present example, both the first word line driver 301 and the second word line driver 302 are shared by the memory cell array units 100. A row decoder 304 and a column decoder 305 are connected to the first word line driver 301 and the second word line driver 302, respectively. In the present example, wiring and reading can be performed in the same manner as the first structural example.

FIG. 35 is a plan view schematically showing the layout of memory cells 101, the first word lines 130 and the second word lines 150 in each memory cell array unit 100 according to the present embodiment. As shown in FIG. 35, the extension directions of the first word lines 130 and the second word lines 150 are defined in accordance with the arrangement directions of the memory cells 101. The intersection angle between the first word lines 130 and the second word lines 150 is a right angle.

FIG. 36 is a plan view schematically showing the layout of the memory cells 101, the first word lines 130 and the second word lines 150 in each memory cell array unit 100 according to a modification example of the present embodiment. As shown in FIG. 36, the extension directions of the first word lines 130 and the second word lines 150 are defined in accordance with the arrangement directions of the memory cells 101.

Furthermore, the layout of memory cells, word lines, etc., described in U.S. patent application Ser. No. 13/420,106 and U.S. patent application Ser. No. 15/257,085 may be applied to each memory cell array unit 100 of the present embodiment. The preset application cites these U.S. patent applications as references.

Figure 37:
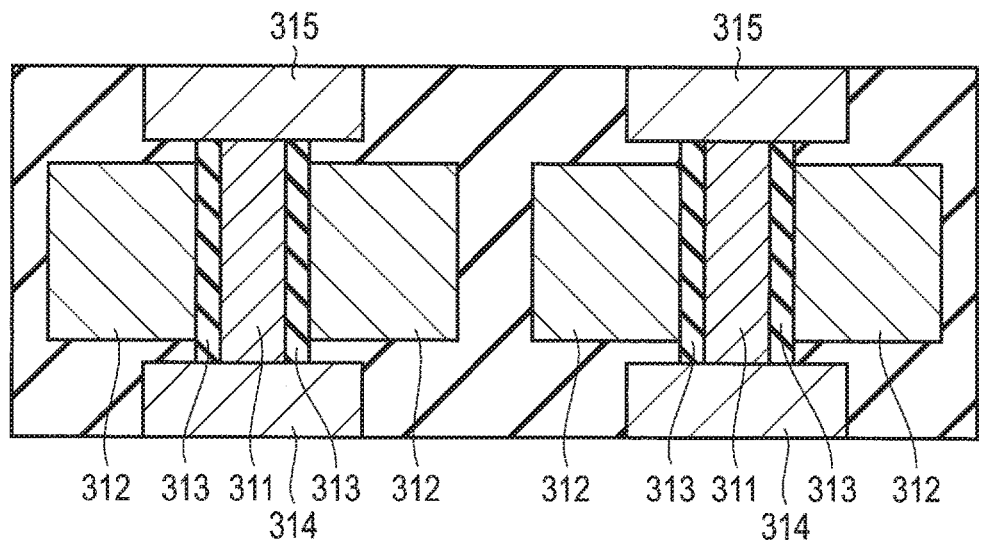
FIG. 37 is a cross-sectional view schematically showing a first structural example of a modification example of the first transistors and the second transistors in each memory cell array unit according to the modification example of the embodiment.

FIG. 37 is a cross-sectional view schematically showing a first structural example of a modification example of the first transistors 120 and the second transistors 140 in each memory cell array unit 100 according to the present embodiment. Each transistor of the above embodiment has a structure in which the gate electrode surrounds the entire side surface of the semiconductor portion (surround-gate type). However, each transistor of the present modification example has a structure in which gate electrodes are formed on two opposite side surfaces of the semiconductor portion (double-gate type). In other words, a gate insulating film 313 is provided on each side surface of a semiconductor portion 311. A pair of gate electrodes 312 is provided so as to interpose the semiconductor portion 311 between the gate electrodes 312. A source 314 and a drain 315 are provided at both ends of the semiconductor portion 311. Each double-gate transistor shown in FIG. 37 also has a current pathway in a direction perpendicular to the main surface of the semiconductor substrate.

Figure 38:
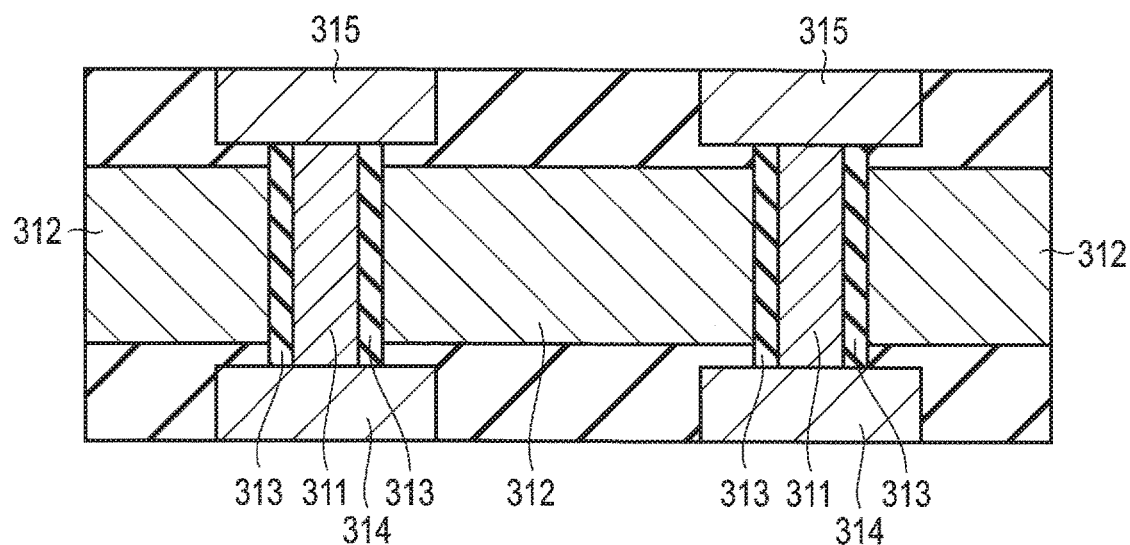
FIG. 38 is a cross-sectional view schematically showing a second structural example of the modification example of the first transistors and the second transistors in each memory cell array unit according to the modification example of the embodiment.

FIG. 38 is a cross-sectional view schematically showing a second structural example of the modification example of the first transistors 120 and the second transistors 140. Each of the transistors shown in FIG. 38 is also a double-gate transistor, and has a structure similar to that of each double-gate transistor shown in FIG. 37. However, in FIG. 38, adjacent transistors share the gate electrode 312. The other basic structures are the same as those of the transistors of FIG. 37.

In the above embodiment, the reference layer 112 is provided like a plate as a continuous film in a single memory cell array unit 100. However, the reference layer 112 may not be provided like a plate as long as it is continuously provided in the x-direction and the y-direction. For example, the reference layer 112 may be a continuous mesh film. Similarly, the shift canceling layer 114 or the intermediate layer 115 may not be provided like a plate as long as each of the layers is continuously provided in the x-direction and the y-direction. Each of the shift canceling layer 114 and the intermediate layer 115 may be a continuous mesh film. Further, the first plate electrode 160 or the second plate electrode 170 may not be provided like a plate as long as each of the layers is continuously provided in the x-direction and the y-direction. Each of the first plate electrode 160 and the second plate electrode 170 may be a continuous mesh film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a memory cell array unit, the memory cell array unit comprising:
a plurality of magnetoresistive elements provided in an array form in a first direction and a second direction, each of the magnetoresistive elements including a first magnetic layer having a variable magnetization direction, a second magnetic layer having a fixed magnetization direction, and a nonmagnetic layer between the first magnetic layer and the second magnetic layer;
a plurality of first transistors provided in an array form in the first direction and the second director, and electrically connected to the magnetoresistive elements, respectively;
a plurality of first word lines each extending in the first direction, and each selecting corresponding first transistors from the plurality of first transistors;
a plurality of switching units each electrically connected to corresponding first transistors of the plurality of first transistors in series, and each including at least one second transistor; and
a plurality of second word lines each extending in the second direction, and each selecting a corresponding switching unit from the plurality of switching units, wherein
the first magnetic layers included in the magnetoresistive elements are separated from each other in the first and second directions, and
the second magnetic layers included in the magnetoresistive elements are continuously provided in the first and second directions.

2. The magnetic memory device of claim 1, wherein the nonmagnetic layers included in the magnetoresistive elements are continuously provided in the first and second directions.

3. The magnetic memory device of claim 1, wherein the nonmagnetic layers included in the magnetoresistive elements are separated from each other in the first and second directions.

4. The magnetic memory device of claim 1, wherein each of the magnetoresistive elements further includes a third magnetic layer having a magnetization direction anti-parallel to the magnetization direction of the second magnetic layer, and
the second magnetic layer is provided between the third magnetic layer and the nonmagnetic layer.

5. The magnetic memory device of claim 4, wherein the third magnetic layers included in the magnetoresistive elements are continuously provided in the first and second directions.

6. The magnetic memory device of claim 1, wherein the memory cell array unit further includes a first plate electrode electrically connected to the magnetoresistive elements and continuously provided in the first and second directions.

7. The magnetic memory device of claim 1, wherein the memory cell array unit further includes a second plate electrode electrically connected to the switching units and continuously provided in the first and second directions.

8. The magnetic memory device of claim 1, wherein each of the switching units includes a single second transistor electrically connected to corresponding first transistors of the plurality of first transistors in series.

9. The magnetic memory device of claim 1, wherein each of the switching units includes a plurality of second transistors each electrically connected to a corresponding first transistor of the plurality of first transistors in series.

10. The magnetic memory device of claim 1, wherein each of the first transistors includes a semiconductor portion having a channel length direction perpendicular to the first direction and the second direction, a gate electrode which surrounds the semiconductor portion, and a gate insulating layer provided between the semiconductor portion and the gate electrode.

11. The magnetic memory device of claim 1, wherein the at least one second transistor each includes a semiconductor portion having a channel length direction perpendicular to the first direction and the second direction, a gate electrode which surrounds the semiconductor portion, and a gate insulating layer provided between the semiconductor portion and the gate electrode.

12. The magnetic memory device of claim 1, wherein a layer including the first transistors is located between a layer including the magnetoresistive elements and a layer including the switching units.

13. The magnetic memory device of claim 1, wherein a layer including the first transistors and a layer including the switching units are provided between a layer including the magnetoresistive elements and a semiconductor substrate.

14. The magnetic memory device of claim 1, wherein a layer including the magnetoresistive elements is provided between a layer including the first transistors and a semiconductor substrate.

15. The magnetic memory device of claim 1, wherein the memory cell array unit further includes a peripheral circuit provided between a semiconductor substrate and an area including the magnetoresistive elements, the first transistors and the switching units.

16. The magnetic memory device of claim 1, wherein the memory cell array unit further includes first and second magnetic shield layers such that the magnetoresistive elements, the first transistors and the switching units are interposed between the first and second magnetic shield layers.

17. The magnetic memory device of claim 1, wherein the second magnetic layers included in the magnetoresistive elements also function as a plate electrode.

18. The magnetic memory device of claim 1, wherein the second direction is perpendicular to the first direction.

19. The magnetic memory device of claim 1, wherein the magnetic memory device comprises a plurality of the memory cell array units.

20. The magnetic memory device of claim 19, further comprising a plurality of sense amplifiers connected to the memory cell array units, respectively.

* * * * *